(12) United States Patent
Cheng et al.

(10) Patent No.: US 8,742,508 B2
(45) Date of Patent: Jun. 3, 2014

(54) THREE DIMENSIONAL FET DEVICES HAVING DIFFERENT DEVICE WIDTHS

(75) Inventors: Kangguo Cheng, Schenectady, NY (US); Bruce B. Doris, Brewster, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 13/184,537

(22) Filed: Jul. 16, 2011

(65) Prior Publication Data

US 2013/0015534 A1    Jan. 17, 2013

(51) Int. Cl.
*H01L 21/70* (2006.01)
(52) U.S. Cl.
USPC 257/368; 257/34; 257/E21.421; 257/E27.026; 257/E29.264
(58) Field of Classification Search
USPC .................. 257/347, 368, E21.421, E21.621, 257/E21.624, E21.635, E21.638, E27.026, 257/E29.264
See application file for complete search history.

(56) References Cited

U.S. PATENT DOCUMENTS

| | | | |
|---|---|---|---|
| 7,803,675 B2 | 9/2010 | Suk et al. | |
| 2005/0167750 A1* | 8/2005 | Yang et al. | 257/347 |
| 2005/0275010 A1 | 12/2005 | Chen et al. | |
| 2007/0082437 A1 | 4/2007 | Cheng et al. | |
| 2007/0254412 A1* | 11/2007 | Dyer et al. | 438/142 |
| 2009/0309162 A1* | 12/2009 | Baumgartner et al. | 257/368 |
| 2011/0073952 A1* | 3/2011 | Kwok et al. | 257/368 |

FOREIGN PATENT DOCUMENTS

EP    2073256 EP    6/2009

OTHER PUBLICATIONS

V. Hariharan, "EEs801 Seminar Report: FinFETs," Electrical Engineering Department, IIT Bombay, Apr. 28, 2005. Downloaded from www.anirbanexpertconsulting.com/FinFETs tutorial_2005.pdf on Jan. 12, 2011.
R. J. Zaman et al., "Effects of Hydrogen Annealing Process Conditions on Nano Scale Silicon (011) Fins," Micro- and Nanosystems-Materials and Devices Symposium, Material Research Society Symposium Proceedings, vol. 872, pp. 37-41, 2005.
W. Xiong et al., "Improvement of FinFET Electrical Characteristics by Hyrdrogen Annealing, " Electron Device Letters, IEEE, vol. 25, No. 8 (2004), pp. 541-543.

(Continued)

*Primary Examiner* — Matthew Reames
*Assistant Examiner* — Farid Khan
(74) *Attorney, Agent, or Firm* — Law Offices of Ira D. Blecker, P.C.

(57) ABSTRACT

A three dimensional FET device structure which includes a plurality of three dimensional FET devices. Each of the three dimensional FET devices include an insulating base, a three dimensional fin oriented perpendicular to the insulating base, a gate dielectric wrapped around the three dimensional fin and a gate wrapped around the gate dielectric and extending perpendicularly to the three dimensional fin, the three dimensional fin having a device width being defined as the circumference of the three dimensional fin in contact with the gate dielectric. At least a first of the three dimensional FET devices has a first device width while at least a second of the three dimensional FET devices has a second device width. The first device width is different than the second device width. Also included is a method of making the three dimensional FET device structure.

12 Claims, 11 Drawing Sheets

(56) References Cited

OTHER PUBLICATIONS

M-C. M. Lee et al, "3D Silicon Transformation Using Hydrogen Annealing," Solid-State Sensor. Actuator and Microsystems Workshop, Jun. 6-10, 2004, pp. 19-22. Downloaded from on Jan. 12, 2011 from http://www.mtl.mit.edu/researchgroups/mems-salon/kevin_Paper.pdf.

R. J. Zaman et al., "Trigate FET Device Characteristics Improvements Using a Hydrogen Anneal Process With a Novel Hard Mask Approach," IEEE Electron Device Letters, vol. 26, No. 10, Oct. 10, 2007, pp. 916-918.

R. J. Zaman et al., "A Novel Low-Cost Trigate Process Suitable for Embedded CMOS 1T-1C Pseudo-SRAM Application," IEEE Transactions on Electronic Devices, vol. 56, No. 3, Mar. 2009, pp. 448-455.

* cited by examiner

US 8,742,508 B2

THREE DIMENSIONAL FET DEVICES HAVING DIFFERENT DEVICE WIDTHS

BACKGROUND

The exemplary embodiments relate to three dimensional semiconductor structures and, more particularly, to three dimensional semiconductor structures having different device widths.

Non-planar, three-dimensional device structures may be used as a replacement for planar devices, which have limitations on scalability. In particular, fin-type field effect transistors (FinFETs) are low-power, high speed non-planar devices that can be more densely packed on a substrate than traditional planar transistors. In addition, FinFETs also offer superior short channel control.

BRIEF SUMMARY

The various advantages and purposes of the exemplary embodiments as described above and hereafter are achieved by providing, according to a first aspect of the exemplary embodiments, a three dimensional FET device structure which includes a plurality of three dimensional FET devices. Each of the plurality of three dimensional FET devices includes an insulating base, a three dimensional fin oriented perpendicularly to the insulating base, a gate including a gate dielectric wrapped around the three dimensional fin and a gate conductor wrapped around the gate dielectric and extending perpendicularly to the three dimensional fin. The three dimensional fin having a device width being defined as the circumference of the three dimensional fin in contact with the gate dielectric. At least a first of the three dimensional FET devices having a first device width and at least a second of the three dimensional FET devices having a second device width such that the first device width being different than the second device width.

According to a second aspect of the exemplary embodiments, there is provided a method of manufacturing a three dimensional FET device structure. The method includes providing a substrate having a semiconductor layer on an insulator layer; forming a plurality of three dimensional fins in the semiconductor layer; applying a masking material to a first fin while exposing a second fin; applying a hydrogen atmosphere to the substrate and exposed second fin for a first predetermined time at a first predetermined temperature and pressure, the hydrogen atmosphere causing the exposed second fin to reflow and change shape; removing the masking material from the first fin; and forming a gate to wrap around each of the first and second fins. The first and second fins are formed having a device width being defined as the circumference of the three dimensional fin in contact with its gate and the first fin having a first device width and a second fin having a second device width with the first device width being different than the second device width.

According to a third aspect of the invention, there is provided a method of manufacturing a three dimensional FET device structure. The method includes providing a substrate having a semiconductor layer on an insulator layer; forming a plurality of three dimensional fins in the semiconductor layer; applying a masking material to a first plurality of fins while exposing a second plurality of fins; applying a hydrogen atmosphere to the substrate and exposed second plurality of fins for a first predetermined time at a first predetermined temperature and pressure, the hydrogen atmosphere causing the exposed second plurality of fins to reflow and change shape while the masked first plurality of fins do not change shape; removing the masking material from the first plurality of fins; and forming a gate to wrap around each of the fins of the first and second plurality of fins, the gate having a longitudinal dimension which is perpendicular to a longitudinal dimension of each of the first and second plurality of fins. The first and second plurality of fins are formed having a device width being defined as the circumference of the three dimensional fin in contact with its gate and the first plurality of fins having a first device width and a second plurality of fins having a second device width with the first device width being different than the second device width.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 1 illustrates a starting structure of at least two vertical fins formed on a semiconductor substrate;

FIG. 2 illustrates covering a first fin with a hard mask while exposing a second fin to a hydrogen bake;

FIG. 3 illustrates the first and second fins after the hydrogen bake;

FIG. 4 illustrates the first and second fins after gates have been formed;

FIG. 5 illustrates the first and second fins after spacers have been formed on the gates; and FIG. 6 is a cross-sectional view of FIG. 5.

FIG. 7 illustrates a starting structure of at least two vertical fins formed on a semiconductor substrate;

FIG. 8 illustrates covering a first fin with a hard mask while exposing a second fin to a first hydrogen bake;

FIG. 9 illustrates covering the second fin with a hard mask while exposing the first fin to a second hydrogen bake;

FIG. 10 illustrates the first and second fins after the first and second hydrogen bakes; and FIG. 11 illustrates the first and second fins after gates have been formed.

DETAILED DESCRIPTION

Fully depleted metal oxide semiconductor field effect transistors (MOSFETs), such as FinFETs or trigates, exhibit superior short channel control. However, the three dimensional (3D) structure of these devices creates several fabrication challenges.

Integrated circuits that include 3D devices such as FinFETs may be fabricated on a bulk semiconductor substrate or, more commonly, on a semiconductor on insulator (SOI) substrate that includes an active SOI layer of a semiconductor, such as silicon, a semiconductor substrate, and a buried insulator layer that separates and electrically isolates the semiconductor substrate from the SOI layer. Each 3D device includes a narrow vertical fin body of semiconductor material with vertically-projecting sidewalls. A gate contact or electrode may intersect a channel region of the fin body and may be isolated electrically from the fin body by a thin gate dielectric layer. Flanking the central channel region at opposite ends of the fin body are heavily-doped source/drain regions.

One particular problem of 3D structures is the quantization of the device width. The device width may be defined as the circumference of the fin in contact with the gate dielectric.

The exemplary embodiments provide a structure and method of tuning the shape of the fin of the 3D device so that 3D device structures are produced having different device widths. Device characteristics are improved by shaping of the fins.

Figure 1:
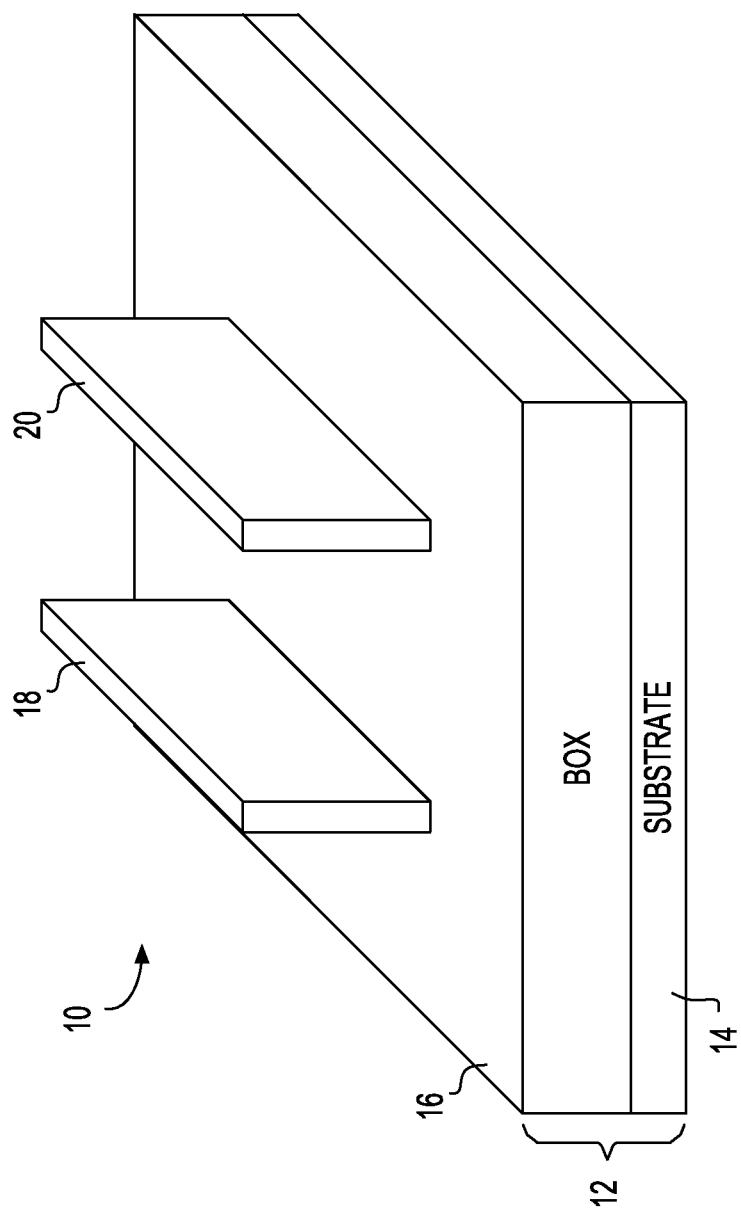
FIGS. 1 to 6 illustrate a process of forming a first exemplary embodiment where.

Referring to the drawings in more detail, a first exemplary embodiment will be discussed. Particularly referring to FIG. 1, there is shown a 3D device structure 10 in an early stage of formation. The 3D device structure 10 includes a substrate 12 which may be a bulk semiconductor substrate, such as silicon, silicon germanium, germanium, III-V compound, or II-VI compound semiconductor, or may be an SOI substrate as shown in FIG. 1. The SOI substrate 12 includes a bottom semiconductor layer 14 and a buried insulator layer 16. The buried insulator layer 16 is typically an oxide so the buried insulator layer 16 may be called a buried oxide layer or simply a BOX layer. Hereafter, layer 16 will be referred to as the BOX layer 16.

On top of BOX layer 16 is usually an SOI layer but in FIG. 1, the SOI layer has been conventionally patterned to form first fin 18 and second fin 20. It should be understood that there will usually be a plurality of such first and second fins 18, 20 but only two such fins are shown for clarity.

First and second fins 18, 20 are conventionally formed from an SOI substrate.

The SOI substrate 12 may be fabricated by any suitable conventional technique, such as a wafer bonding technique or a separation by implantation of oxygen (SIMOX) technique, familiar to a person having ordinary skill in the art. The thickness of the SOI layer determines the vertical height of the first and second fins 18, 20. The SOI layer may have a thickness that varies from about 10 nm to about 50 nm.

A pad layer may be formed on the SOI layer of the SOI substrate 12. The pad layer may be composed of a nitride formed utilizing a conventional deposition process such as chemical vapor deposition (CVD) or plasma-assisted CVD. The material constituting the pad layer may be selected such that the pad layer functions as a hardmask. The material forming the pad layer must also etch selectively to the material constituting the SOI layer.

Thereafter, the pad layer may be patterned by a conventional lithography and dry etching process. The pattern in the patterned pad layer is then transferred into the SOI layer by an etching process using the patterned pad layer as an etch mask. The etching process removes the material of the SOI layer selective to the material of the BOX layer 16. The pad layer may then be removed. The result is the first and second fins 18, 20 on BOX layer 16 and semiconductor substrate 12 shown in FIG. 1.

Figure 2:
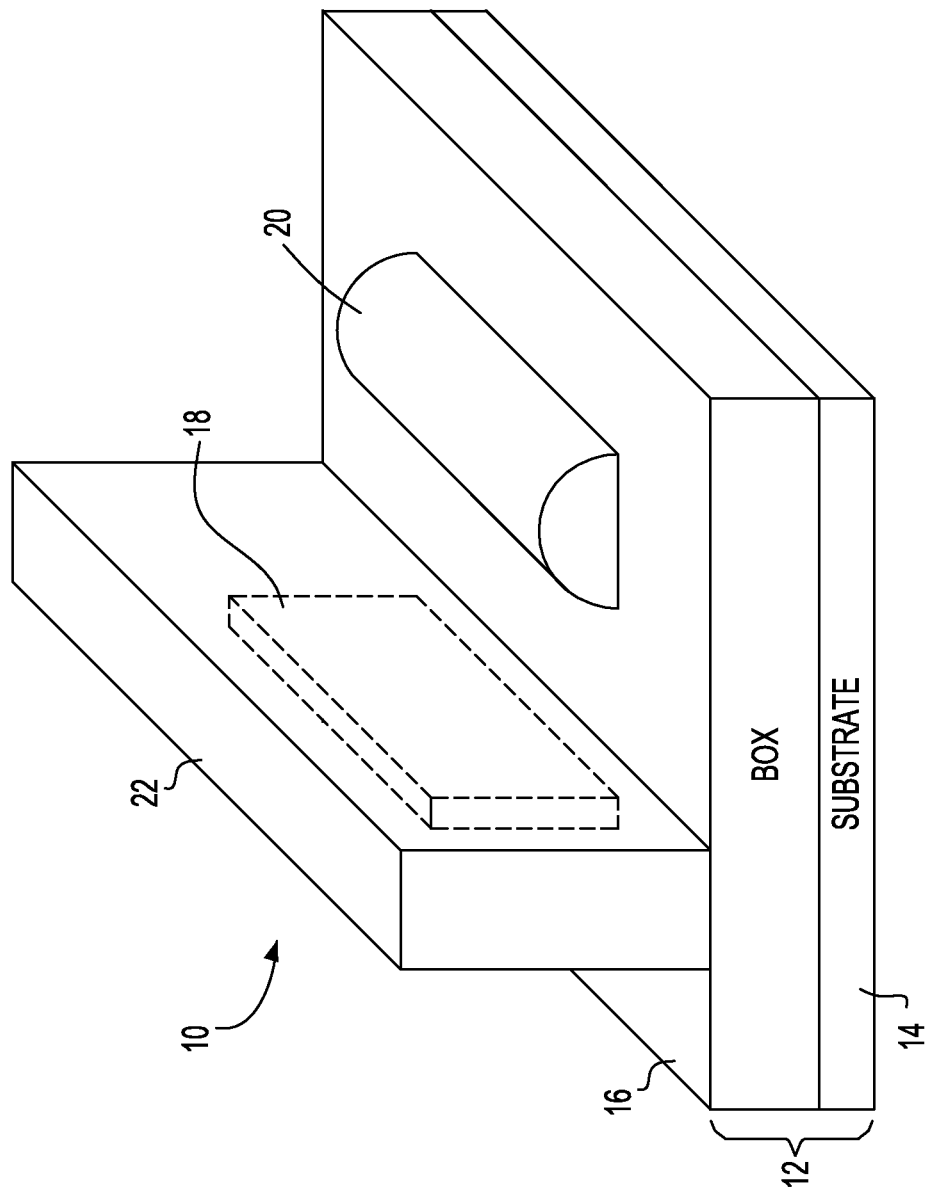

Referring now to FIG. 2, a hard mask layer 22, such as a nitride, is conventionally deposited and patterned to cover the first fin 18 (now shown in phantom) but leave the second fin 20 exposed. Thereafter, the substrate may be subjected to a hydrogen bake to reflow the exposed second fin 20, resulting in the second fin 20 having the rounded profile shown in FIG. 2.

Deuterium (D or $^2$H) is an isotope of hydrogen (H). Deuterium is often referred to as heavy hydrogen. The hydrogen bake of the exemplary embodiments may be performed with hydrogen gas ($H_2$) composed of hydrogen (H) with a mass number of about 1, with deuterium gas ($^2H_2$) composed of deuterium ($^2$H) with a mass number of about 2 or combinations of hydrogen gas and deuterium gas. It should be understood that whenever a hydrogen bake is mentioned, the hydrogen utilized may be hydrogen, deuterium or combinations of hydrogen and deuterium.

The hydrogen bake may be performed in a hydrogen environment at 800 to 1000° C. with a pressure of 50-100 Torr for 20 to 60 seconds. The hydrogen bake lowers the surface energy of the second fin 20 so that the second fin 20 changes shape from a rectangular fin to a rounded fin.

The conditions of the hydrogen bake may be varied to change the shape and material of the vertical fin in a controlled way so that shapes other than the semicircular second fin 20 may be obtained.

Figure 3:
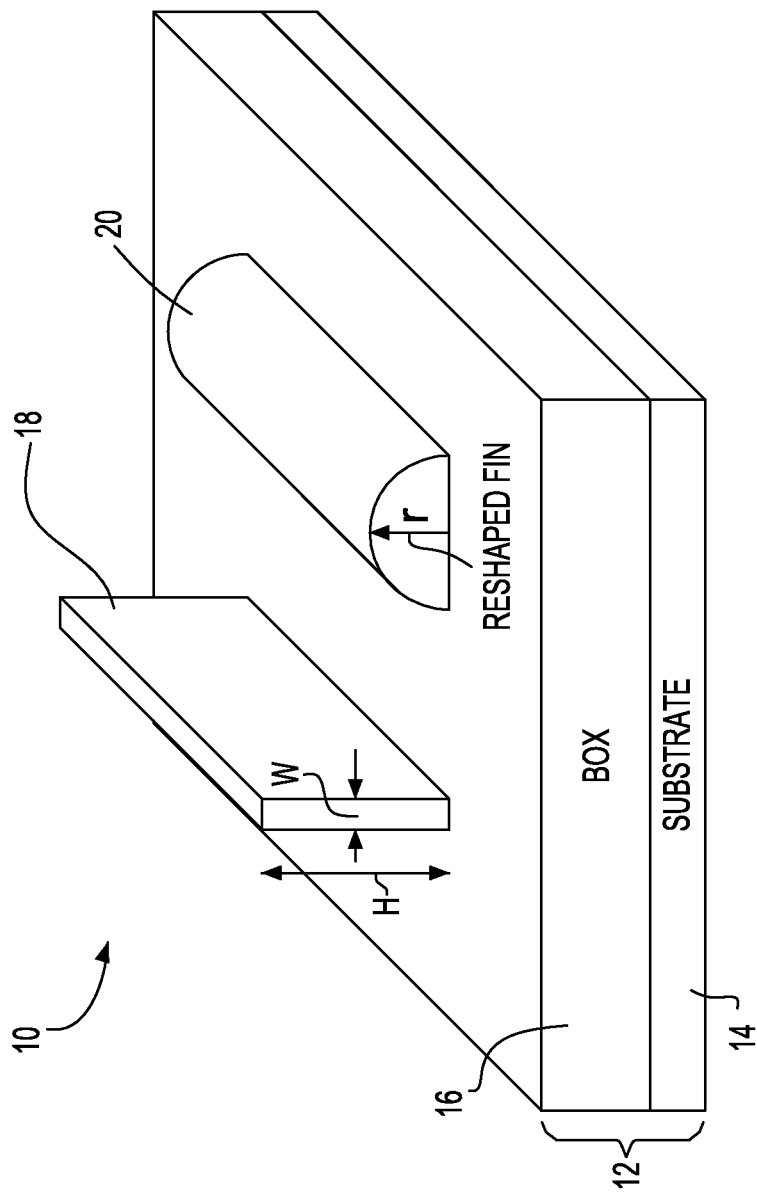

After the hydrogen bake, the hard mask layer 22 may be conventionally stripped to result in the structure shown in FIG. 3. First fin 18 may retain its original shape while second fin 20 has a modified shape.

The device widths may be determined for each of the first fin 18 and second fin 20. First fin 18 has a height H and a width W so that its device width is (2×H+W) which is the circumference of the first fin 18 that will be contact with the gate dielectric that is applied in a subsequent process. The device width of second fin 20 may be determined by the equation (Pi×r) which is the circumference of the second fin 20 that will be in contact with the gate dielectric that is applied in a subsequent process.

Figure 4:
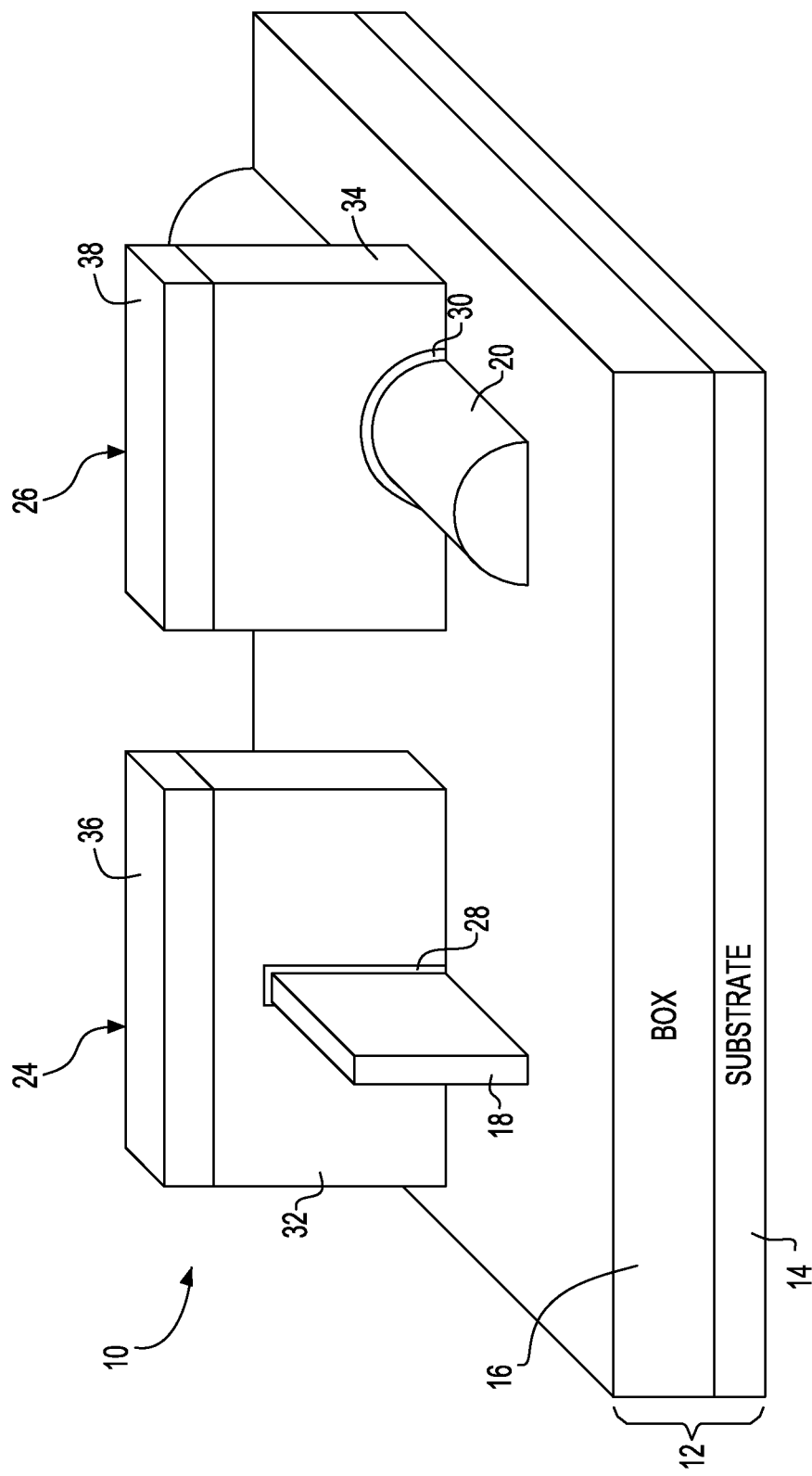

Referring now to FIG. 4, gates 24, 26 are then formed for each of the first fin 18 and second fin 20. The gates 24, 26 may include a gate dielectric 28, 30, a gate conductor 32, 34 and a gate hardmask 36, 38. The gate dielectric 28, 30 for the first and second fins 18, 20, respectively, may include a high-k gate dielectric or any other gate dielectric material. The gate conductor 32, 34 for the first and second fins 18, 20, respectively, may include a metal gate or any other suitable gate material. The gate hard mask 36, 38 for the first and second fins 18, 20, respectively, may include a nitride or any other gate hardmask. The gate dielectric 28, 30, gate conductor 32, 34 and gate hardmask 36, 38 may be formed by conventional deposition and patterning of gate dielectric, gate conductor and gate hardmask materials as is known to a person skilled in the art. The gate dielectric 28 and gate conductor 32 for gate 24 may be the same or different than the gate dielectric 30 and gate conductor 34 for gate 26 as required by the design of the 3D device structure 10.

Figure 5:
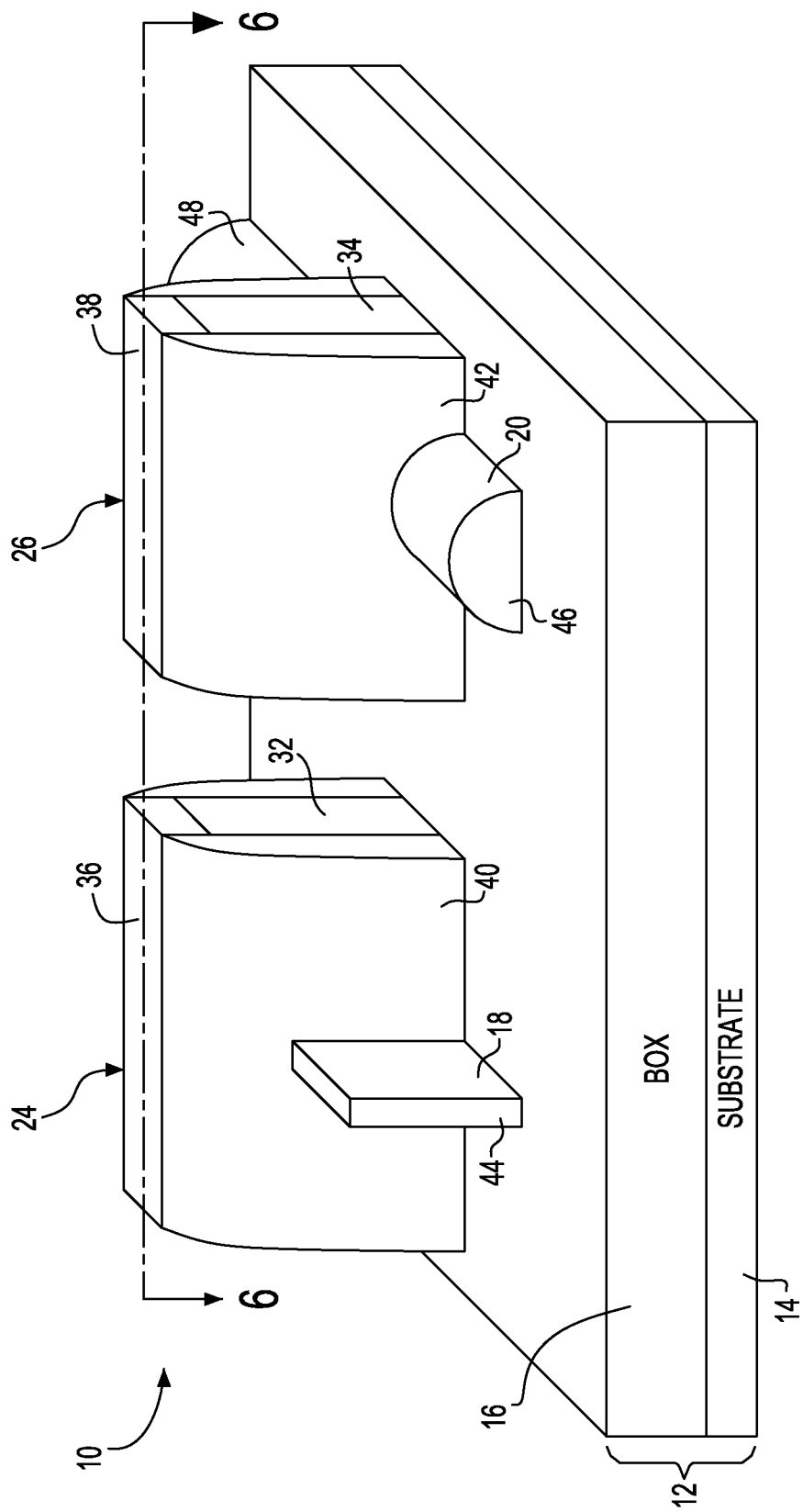

Referring now to FIG. 5, spacers 40, 42 have been conventionally formed on gates 24, 26 by deposition of a spacer material, such as a nitride, followed by a dry etching process. Sources 44, 46 and drains 48 (the drain for first fin 18 is hidden by gate 24) may be formed, for example, by doping. The spacers 40, 42, sources 44, 46 and drains 48 for each of the structures in the 3D device structure 10 may be the same or different as required by the design of the 3D device structure 10.

Figure 6:
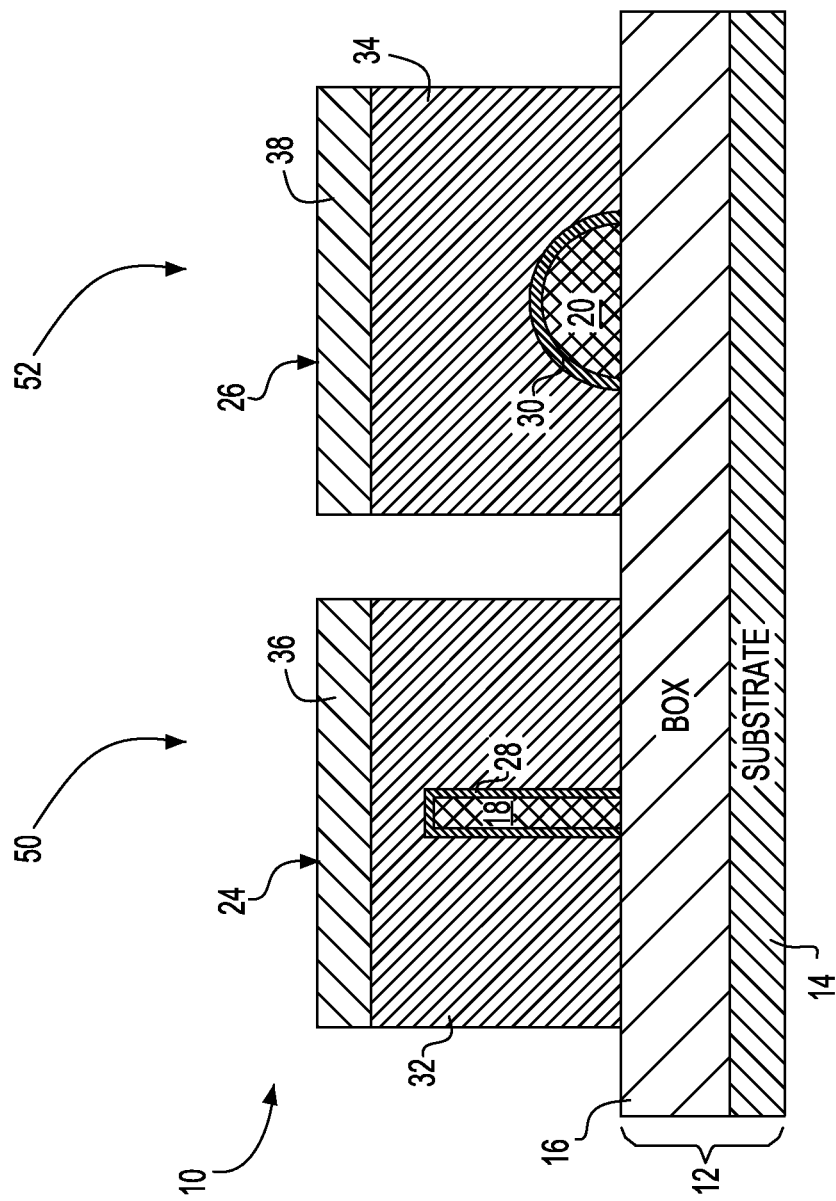

A cross section of the 3D device structure shown in FIG. 5 is taken in the plane indicated by arrows 6-6 and shown in FIG. 6. Shown is a 3D device structure 10 including a first 3D device 50 (such as a FinFET or Trigate device) and a second 3D device 52 (such as a FinFET or Trigate device). The first 3D device 50 has a first device width and the second 3D device 52 has a second device width such that the first device width is different from the second device width. The difference in device width is more than that obtained just through manufacturing tolerances. In an exemplary embodiment, the first device width and the second device width should differ by at least 20%.

Figure 7:
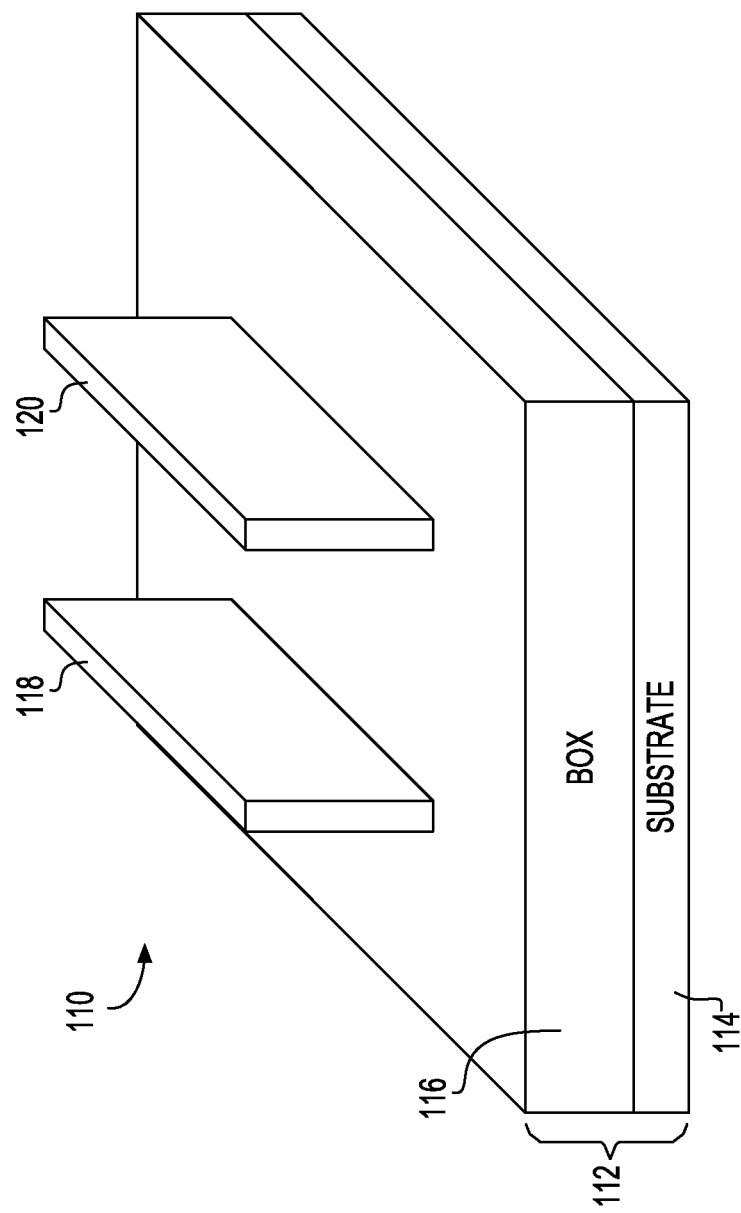
FIGS. 7 to 11 illustrate a process of forming a second exemplary embodiment where.

Referring now to FIG. 7, a second exemplary embodiment of the 3D device structure 110 will be discussed. The starting structure shown in FIG. 7 is the same starting structure shown in FIG. 1. The 3D device structure 110 includes a substrate 112 which may be a bulk semiconductor substrate, such as silicon, or may be an SOI substrate as shown in FIG. 7. The SOI substrate 112 includes a bottom semiconductor layer 114 and a BOX layer 116.

As discussed above with respect to FIG. 1, the SOI layer has been conventionally patterned to form first fin 118 and second fin 120. It should be understood that there will usually be a plurality of such first and second fins 118,120 but only two such fins are shown for clarity.

Figure 8:
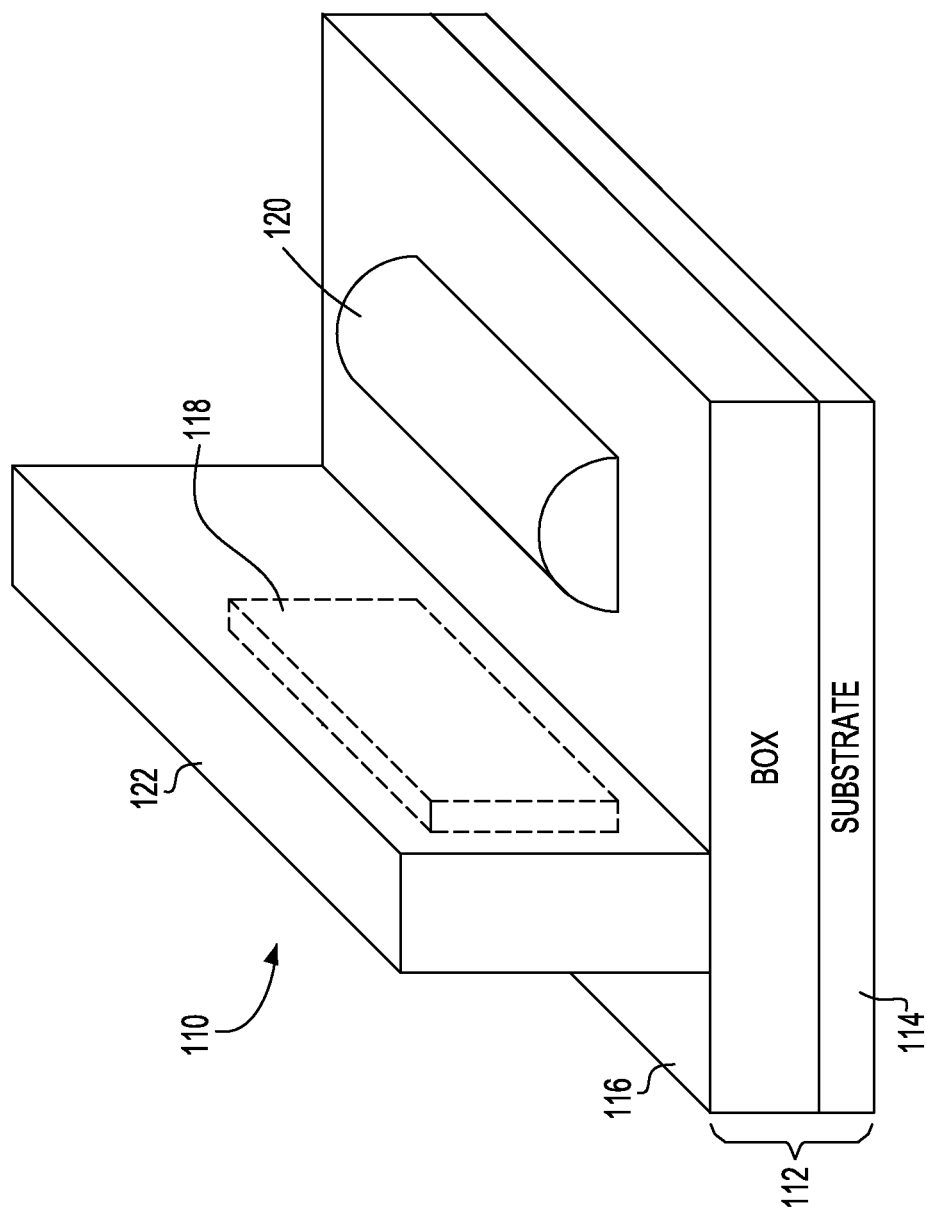

Referring now to FIG. 8, a hard mask layer 122, such as a nitride, is conventionally deposited and patterned to cover the first fin 118 (now shown in phantom) but leave the second fin 120 exposed. Thereafter, the substrate may be subjected to a hydrogen bake to reflow the exposed second fin 120, resulting in the second fin 120 having the rounded profile shown in FIG. 8.

The hydrogen bake may be performed in a hydrogen environment at 800 to 1000° C. with a pressure of 50-100 Torr for 20 to 60 seconds.

The conditions of the hydrogen bake may be varied to change the shape of the vertical fin in a controlled way so that shapes other than the semicircular second fin 120 may be obtained.

After the hydrogen bake, the hard mask layer 122 may be conventionally stripped. First fin 118 may retain its original shape after the hydrogen bake while second fin 120 has a modified shape.

In this second exemplary embodiment, there may be two different hydrogen bakes so as result in two different types of fins.

Figure 9:
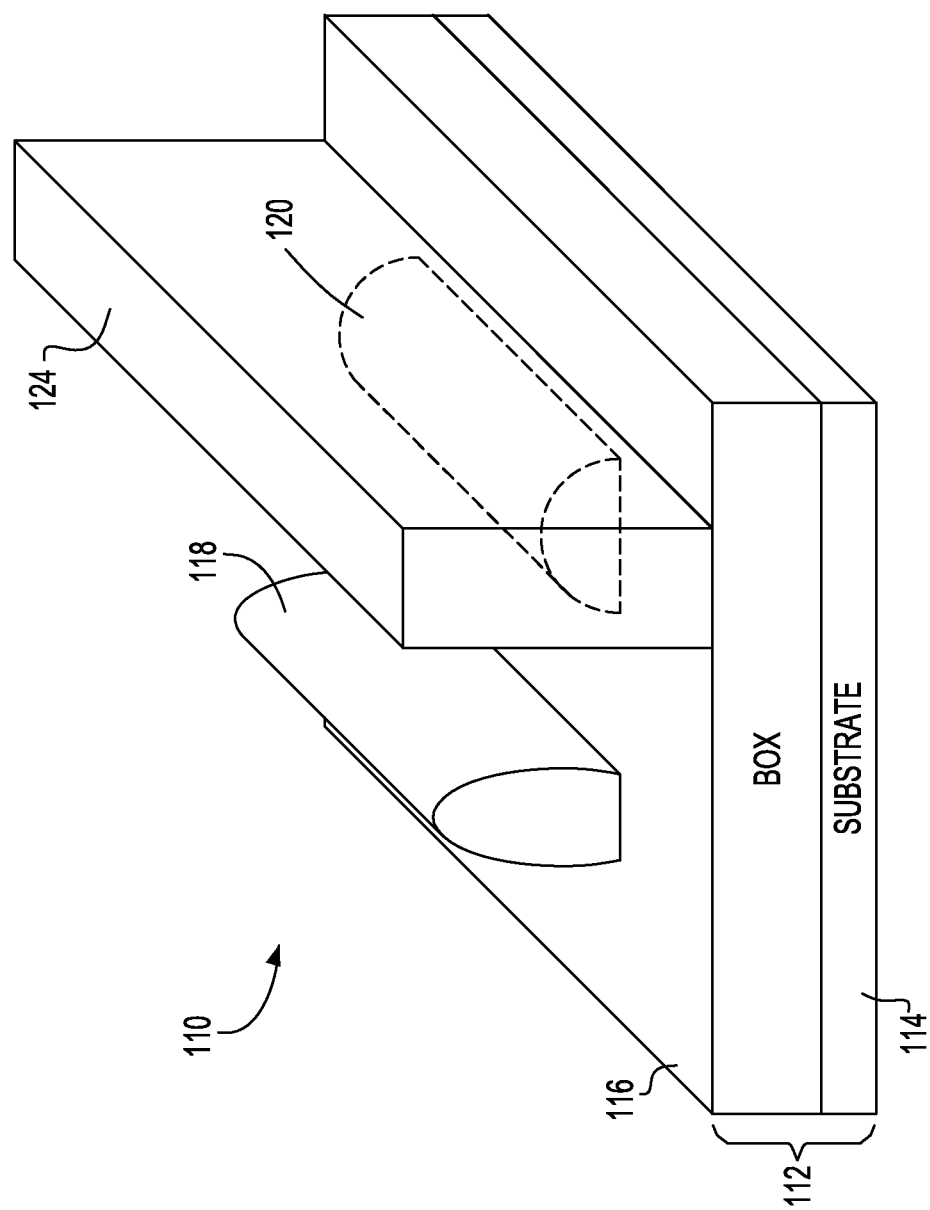

Referring now to FIG. 9, another hard mask 124, such as a nitride, is conventionally deposited and patterned to cover the second fin 120 (now shown in phantom) but leave the first fin 118 exposed. Thereafter, the substrate may be subjected to the second hydrogen bake to reflow the exposed second fin 118, resulting in the first fin 118 having the rounded profile to form part of an oval (i.e., semioval) as shown in FIG. 9. Note that the configuration of first fin 118 may be different than the configuration of second fin 120.

The first hydrogen bake may be performed at 950° C. with a pressure of 80 Torr for 60 seconds while the second hydrogen bake may be performed at 850° C. with a pressure of 80 Torr for 60 seconds.

Figure 10:
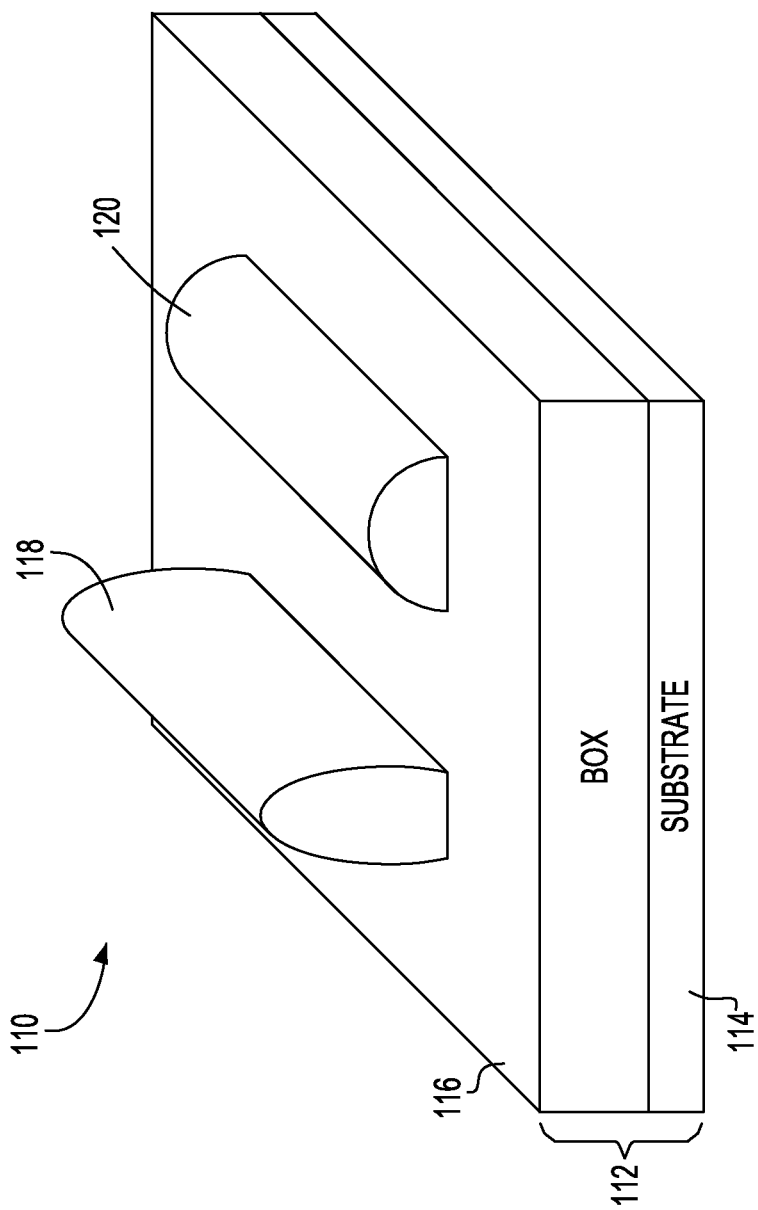

After the second hydrogen bake, the hard mask layer 124 may be conventionally stripped to result in the structure shown in FIG. 10. As a result of the two hydrogen bakes, the shapes of first fin 118 and second fin 120 have been modified but in different ways so that fins of two different device widths have been obtained.

Subsequent processing may then take place to form the gate dielectric, gate conductor, gate hard mask, spacers, sources and drains as discussed with respect to the first exemplary embodiment.

Figure 11:
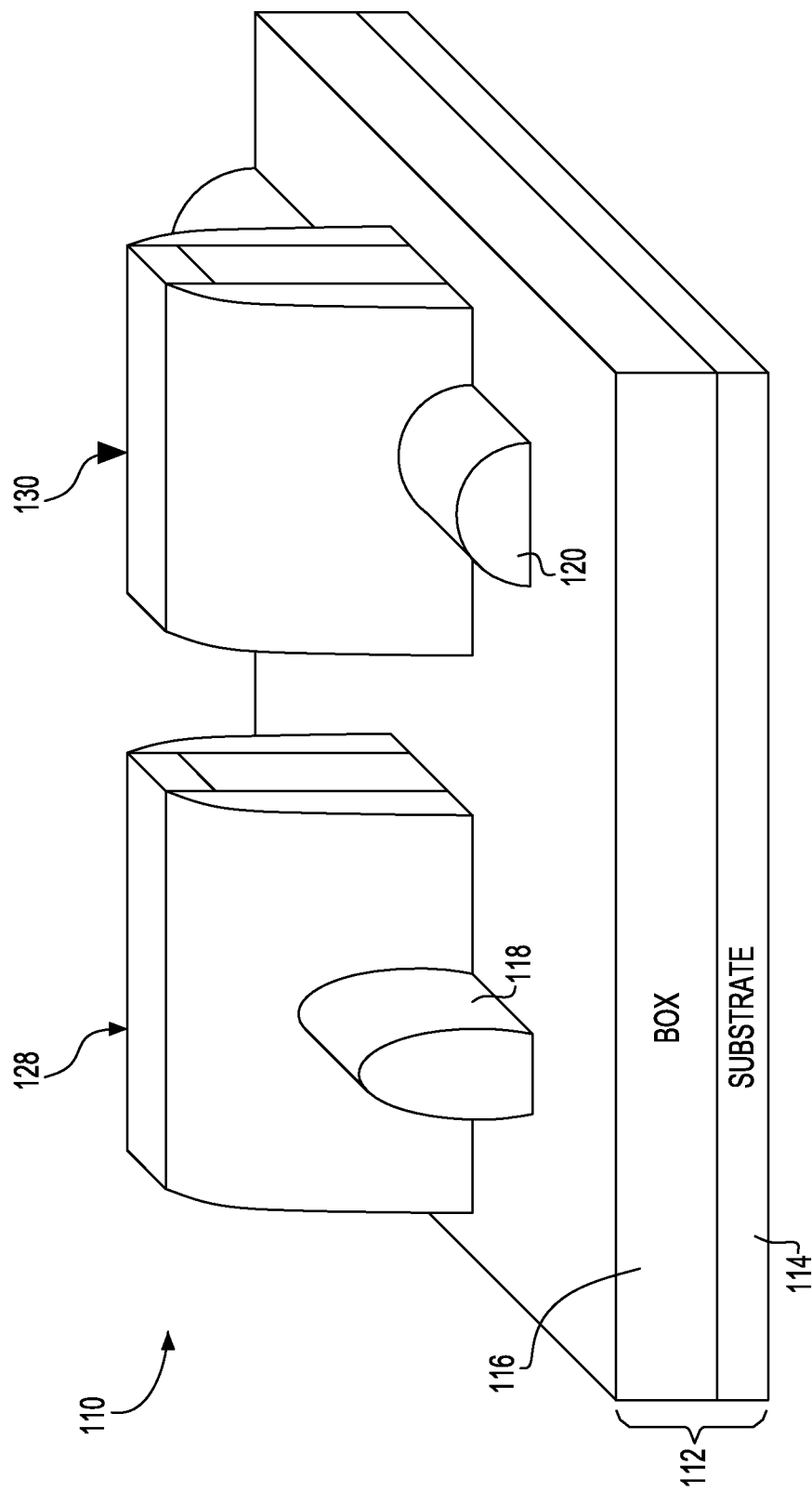

Shown in FIG. 11 is a 3D device structure 110 including a first 3D device 128 (such as a FinFET or Trigate device) and a second 3D device 130 (such as a FinFET or Trigate device). The first 3D device 128 has a first device width and the second 3D device 130 has a second device width such that the first device width is different from the second device width. The difference in device width is more than that obtained just through manufacturing tolerances. In an exemplary embodiment, the first device width and the second device width should differ by at least 20%.

While the exemplary embodiments have been discussed with fins of two device widths, it should be understood that contemplated within the scope of the exemplary embodiments are 3D device structures with fins of three or more device widths.

Further, once the 3D device structures have been formed as described, further conventional processing known to those skilled in the art may take place such as forming contacts, depositing an interlevel dielectric, back end of the line wiring layers, etc.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

The invention claimed is:

1. A three dimensional FET device structure comprising:
a plurality of three dimensional FET devices each comprising an insulating base, a three dimensional fin oriented perpendicularly to the insulating base, a gate comprising a gate dielectric wrapped around the three dimensional fin and a gate conductor wrapped around the gate dielectric and extending perpendicularly to the three dimensional fin, the three dimensional fin having a device width being defined as the circumference of the three dimensional fin in contact with the gate dielectric;
at least a first of the three dimensional FET devices having a first device width and the fin of the first of the three dimensional FET devices having a flat surface in contact with the insulating base; and
at least a second of the three dimensional FET devices having a second device width such that the first device width being different than the second device width and the fin of the second of the three dimensional FET devices having a flat surface in contact with the insulating base;
wherein the fin of at least one of the first and second three dimensional FET devices having a rounded surface opposite the flat surface in contact with the insulating base; and
wherein the fin of the first of the three dimensional FET devices having a rectangular cross section and the fin of the second of the three dimensional FET devices having a semicircular cross section.

2. The three dimensional device structure of claim 1 wherein the three dimensional fin of the first three dimensional FET device having a cross-sectional configuration that is different than the cross-sectional configuration of the three dimensional fin of the second three dimensional FET device.

3. The three dimensional device structure of claim 1 wherein the insulating base is an oxide.

4. The three dimensional device structure of claim 1 further comprising a semiconductor material supporting the insulating base.

5. The three dimensional device structure of claim 1 further comprising spacers on the gate of the first and second three dimensional FET devices.

6. The three dimensional device structure of claim 1 wherein the first and second three dimensional FET devices are FinFET devices.

7. The three dimensional device structure of claim 1 wherein the first and second three dimensional FET devices are trigate devices.

8. The three dimensional device structure of claim 1 further comprising at least a third of the three dimensional FET devices having a third device width such that the first device width, second device width and third device width are all different.

9. The three dimensional device structure of claim 8 comprising a plurality of first, second and third three dimensional FET devices.

10. The three dimensional device structure of claim 1 comprising a plurality of first and second three dimensional FET devices.

11. A three dimensional FET device structure comprising:
a plurality of three dimensional FET devices each comprising an insulating base, a three dimensional fin oriented perpendicularly to the insulating base, a gate comprising a gate dielectric wrapped around the three dimensional fin and a gate conductor wrapped around the gate dielectric and extending perpendicularly to the three dimensional fin, the three dimensional fin having a device width being defined as the circumference of the three dimensional fin in contact with the gate dielectric;
at least a first of the three dimensional FET devices having a first device width and the fin of the first of the three dimensional FET devices having a flat surface in contact with the insulating base; and
at least a second of the three dimensional FET devices having a second device width such that the first device width being different than the second device width and the fin of the second of the three dimensional FET devices having a flat surface in contact with the insulating base;
wherein the fin of at least one of the first and second three dimensional FET devices having a rounded surface opposite the flat surface in contact with the insulating base; and
wherein the fin of the first of the three dimensional FET devices having a semioval cross section and the fin of the second of the three dimensional FET devices having a semicircular cross section.

12. The three dimensional device structure of claim 1 wherein the gate corresponding to the second of the three dimensional FET devices is wrapped around the rounded surface of the fin of the second of the three dimensional FET devices.

* * * * *